US012772464B2

(12) United States Patent
Zheng et al.

(10) Patent No.: US 12,772,464 B2
(45) Date of Patent: Oct. 20, 2026

(54) PACKAGED MEMORY DEVICE WITH OVERHANG SUPPORT STRUCTURE

(71) Applicant: Sandisk Technologies, Inc., Milpitas, CA (US)

(72) Inventors: Shujun Zheng, Shanghai (CN); Jason Xiao, Shanghai (CN); Youhua Xu, Shanghai (CN); Yvonne Ming, Shanghai (CN); Jiun Dong Loeh, Penang (MY); Shino Jian, Shanghai (CN); Fen Yu, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 493 days.

(21) Appl. No.: 18/448,296

(22) Filed: Aug. 11, 2023

(65) Prior Publication Data

US 2024/0397735 A1 Nov. 28, 2024

Related U.S. Application Data

(60) Provisional application No. 63/504,647, filed on May 26, 2023.

(51) Int. Cl.

| | |
|---|---|
| ***H10W 90/24*** | (2026.01) |
| ***H10B 80/00*** | (2023.01) |
| ***H10W 90/00*** | (2026.01) |
| *H10W 90/20* | (2026.01) |

(52) U.S. Cl.

CPC ............ *H10B 80/00* (2023.02); *H10W 90/00* (2026.01); *H10W 90/231* (2026.01); *H10W 90/24* (2026.01); *H10W 90/752* (2026.01)

(58) Field of Classification Search

None

See application file for complete search history.

(56) References Cited

U.S. PATENT DOCUMENTS

| | | | | |
|---|---|---|---|---|
| 11,721,672 | B2 * | 8/2023 | Sano | H10D 64/252 257/666 |
| 2005/0022697 | A1 * | 2/2005 | Benrashid | G03F 7/0757 257/E33.059 |
| 2011/0079890 | A1 * | 4/2011 | Song | H01L 25/0657 257/777 |
| 2019/0035705 | A1 * | 1/2019 | Mao | H10W 72/00 |
| 2021/0111152 | A1 * | 4/2021 | Park | H10W 70/611 |
| 2023/0420414 | A1 * | 12/2023 | Baek | H10B 80/00 |
| 2024/0274580 | A1 * | 8/2024 | Che | H01L 25/0657 |

* cited by examiner

*Primary Examiner* — William Henry Anderson

(74) *Attorney, Agent, or Firm* — Michael Best & Friedrich LLP

(57) ABSTRACT

A memory device includes a substrate, a controller die attached to the substrate, and a memory die stack. The memory die stack includes a first silicon die having a first contact pad surface and a bottom surface attached to the substrate. The memory die stack includes a second silicon die stacked on the first silicon die, the second silicon die including a second contact pad surface. An overhang portion of the second silicon die extends beyond the first silicon die. The memory die stack includes a printed support structure attached to the substrate, the printed support structure supporting the overhang portion of the second silicon die, and one or more bond wires that electrically connect the first and second contact pad surfaces to the substrate, thereby electrically connecting the first and second silicon dies to the controller die by way of the substrate.

20 Claims, 14 Drawing Sheets

PACKAGED MEMORY DEVICE WITH OVERHANG SUPPORT STRUCTURE

CROSS-REFERENCE TO RELATED APPLICATION

This application claims priority to and the benefit of U.S. Provisional Patent Application No. 63/504,647, filed on May 26, 2023, the entire contents of which is incorporated herein by reference.

BACKGROUND

The present disclosure relates to storage devices. More particularly, the present disclosure relates to a printed support structure for stacked memory dies.

The capacity and speed of memory arrangements in data storage devices, such as solid state drives (SSDs), is continually improving as technology advances. Demand for higher processing speeds requires increased throughput of memory arrangements. As such, manufacturers of storage devices seek to increase both storage capacity and data throughput for their devices. While it is desirable to increase storage capacity of memory arrangements, increasing the size of the packaged memory device may be undesirable. Further, such improvements are nearly always sought to be implemented at a relatively low cost.

SUMMARY

NAND dies can be stacked vertically on a substrate and staggered to allow for connections to be made by way of top or bottom located connection pads. This vertical and staggered arrangement reduces the lateral footprint of the NAND dies while maintaining the ease of access to the connection pads during wire bonding relative to connection pads located adjacent a vertical edge of the NAND dies, thereby allowing for a smaller overall form factor and easier manufacturing.

This staggered arrangement results in at least one memory die having an overhang portion unsupported by a lower memory die. This overhang portion of the memory die may crack when bond force is applied on the pad area during the wire bonding process. Traditionally, to avoid this crack, the length of the overhang portion is decreased, and the die thickness is increased. However, this increases the thickness of the overall memory package. Three-dimensional (3D) printed electronics have been applied in 3D conformal electronics, flexible 3D printed electronics, and stretchable 3D printed electronics applications. Examples, aspects, and implementations described herein provide a 3D-printed support structure that supports the overhang portion during wire bonding while allowing for a decrease in thickness of the memory package.

For example, embodiments described herein provide a stable elastomeric layer including a support structure to support the overhang portion of a memory die via 3D inkjet printing. Using this elastomeric buffer structure, extra strain caused by bond force is released and die cracks are avoided. Additionally, example support structures provided herein allow for a multilayer stack-up structure with increased overhang distance and decreased die thickness, achieving higher storage capacity relative to traditional memory devices.

The disclosure provides a memory device including a substrate and a memory die stack. The memory die stack includes a first silicon die having a first contact pad surface and a bottom surface attached to the substrate. The memory die stack includes a second silicon die including a second contact pad surface. An overhang portion of the second silicon die extends beyond the first silicon die. The memory die stack includes a printed support structure attached to the substrate, the printed support structure supporting the overhang portion of the second silicon die, and one or more bond wires that electrically connect the first and second contact pad surfaces to the substrate, thereby electrically connecting the first and second silicon dies to the controller die by way of the substrate.

The disclosure also provides a memory device including a substrate, a plurality of silicon dies attached one atop another in an offset manner, and a printed support structure attached to the substrate. A bottom one of the silicon dies is attached to the substrate. A second one of the silicon dies is situated above the bottom one of the silicon dies, the second one of the silicon dies including an overhang potion that hangs beyond each other silicon die included I the plurality of silicon dies. The printed support structure supports the overhang portion of the second one of the silicon dies.

The disclosure also provides a method of assembly a memory device. The method includes printing a support structure onto a substrate and attaching a stack of silicon dies to the substrate. The stack of silicon dies includes a first silicon die contacting the substrate and a second silicon die situated above the first silicon die and offset from the first silicon die in a lateral direction to form an offset portion. The offset portion of the second silicon die is supported by the support structure. The method includes electrically connecting each silicon die included in the stack of silicon dies to the substrate with one or more bond wires.

In this manner, various aspects of the disclosure provide for improvements in at least the technical fields of memory devices and their design and architecture. The foregoing summary is intended solely to give a general idea of various aspects of the disclosure, and does not limit the scope of the disclosure in any way. Other aspects of the disclosure will become apparent by consideration of the detailed description, the claims, the Abstract, and the accompanying drawings.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. It also will be understood by those of skill in the art that the drawings are not to scale, where some features are exaggerated in order to highlight such features.

Figure 1:
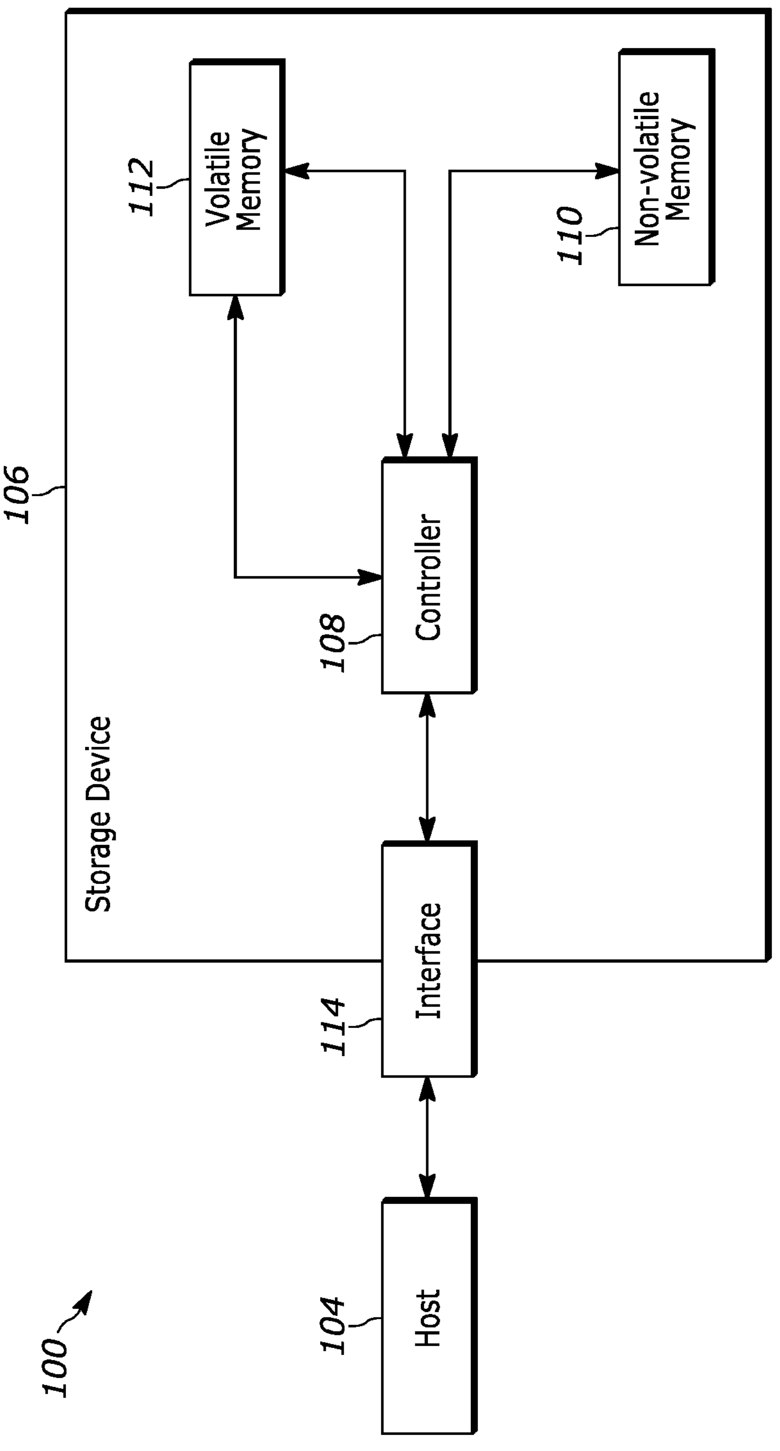
FIG. 1 is a block diagram illustrating a data storage system, according to embodiments described herein.

FIG. 1 is a block diagram illustrating a storage system 100 with a storage device 106 that may function in conjunction with a host device 104, in accordance with one or more techniques of this disclosure. For instance, the host device 104 may utilize non-volatile memory devices included in storage device 106 to store and retrieve data.

The storage system 100 includes the host device 104 that may store and/or retrieve data to and/or from the storage device 106. As illustrated in FIG. 1, the host device 104 may communicate with the storage device 106 by way of an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1, the storage device 106 includes a controller 108, non-volatile memory (NVM) 110, volatile memory 112, and an interface 114. In some examples, the storage device 106 may include additional components not shown in FIG. 1 for sake of clarity. For example, the storage device 106 may include a printed circuit board (PCB) to which components of the storage device 106 are mechanically attached and that includes electrically conductive traces that electrically interconnect components of the storage device 106, or the like. In some embodiments, the storage device 106 may include fewer components, for example, where one or more of the volatile memory 112 and the interface 114 are part of the controller 108. In some examples, the physical dimensions and connector configurations of the storage device 106 may conform to one or more standard form factors. Some example standard form factors of the storage device may include 3.5" data storage device, 2.5" data storage device, and 1.8" data storage device. Some example standard form factors of the interface 114 may include peripheral component interconnect (PCI), PCI-extended (PCI-X), and PCI Express (PCIe) (e.g., PCIe x1, x4, x8, x16, PCIe Mini Card, MiniPCI, etc.). In some examples, the storage device 106 may be directly attached (e.g., directly soldered) to a motherboard of the host device 104.

The interface 114 of the storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), or the like. The interface 114 is communicatively connected (e.g., a data bus, a control bus, or other suitable connection) to the controller 108, allowing data to be exchanged between the host device 104 and the controller 108. In some examples, the interface 114 may also permit the storage device 106 to receive power from the host device 104.

The NVM 110 may be part of a packaged integrated circuit (IC) or other packaged silicon device, such as a memory device. The NVM 110 may also include read/write circuitry that reads data from and writes data to another portion of the memory device. For instance, the read/write circuitry of the NVM 110 may receive data and a message from the controller 108 that instructs the read/write circuitry to store the data in the NVM 110. Similarly, the read/write circuitry of the NVM 110 may receive a message from the controller 108 that instructs the read/write circuitry to retrieve data from the NVM 110. In some examples, each die (i.e., the controller 108 and memory dies making up the NVM 110 of the memory device) may be individually referred to as a silicon die.

In some examples, the memory device may include any type of non-volatile memory. For example, the NVM 110 may include flash memory or any other suitable non-volatile memory. Flash memory may include NAND-based or NOR-based flash memory, and may store data based on a charge contained in a floating gate of a transistor for each flash memory cell. In NAND-based flash memory, the flash memory may be divided into a plurality of blocks that may divided into a plurality of pages. Each block of the plurality of blocks may include a plurality of NAND cells. Rows of NAND cells may be electrically connected using a word line to define a page of a plurality of pages. Respective cells in each of the plurality of pages may be electrically connected to respective bit lines. Furthermore, the NAND-based flash memory may be 2D or 3D, and may be configured as a single-level cell (SLC) memory, a multi-level cell (MLC) memory, a triple-level cell (TLC) memory, or a quad-level cell (QLC) memory.

The volatile memory 112 may be used by the controller 108 to store information. The volatile memory 112 may be comprised of one or more volatile memory devices. In some examples, the controller 108 may use the volatile memory 112 as a cache. For instance, the controller 108 may store cached information in the volatile memory 112 until the cached information is written to the NVM 110. Examples of the volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The controller 108 manages one or more operations of the storage device 106. For instance, the controller 108 manages the reading of data from and/or the writing of data to the NVM 110. In some embodiments, when the storage device 106 receives a write command from the host device 104, the controller 108 may initiate a data storage command to store data to the NVM 110 and monitor the progress of the data storage command. In other embodiments, the controller 108 may determine at least one operational characteristic of the storage system 100 and store the at least one operational characteristic in the NVM 110.

Figure 2:
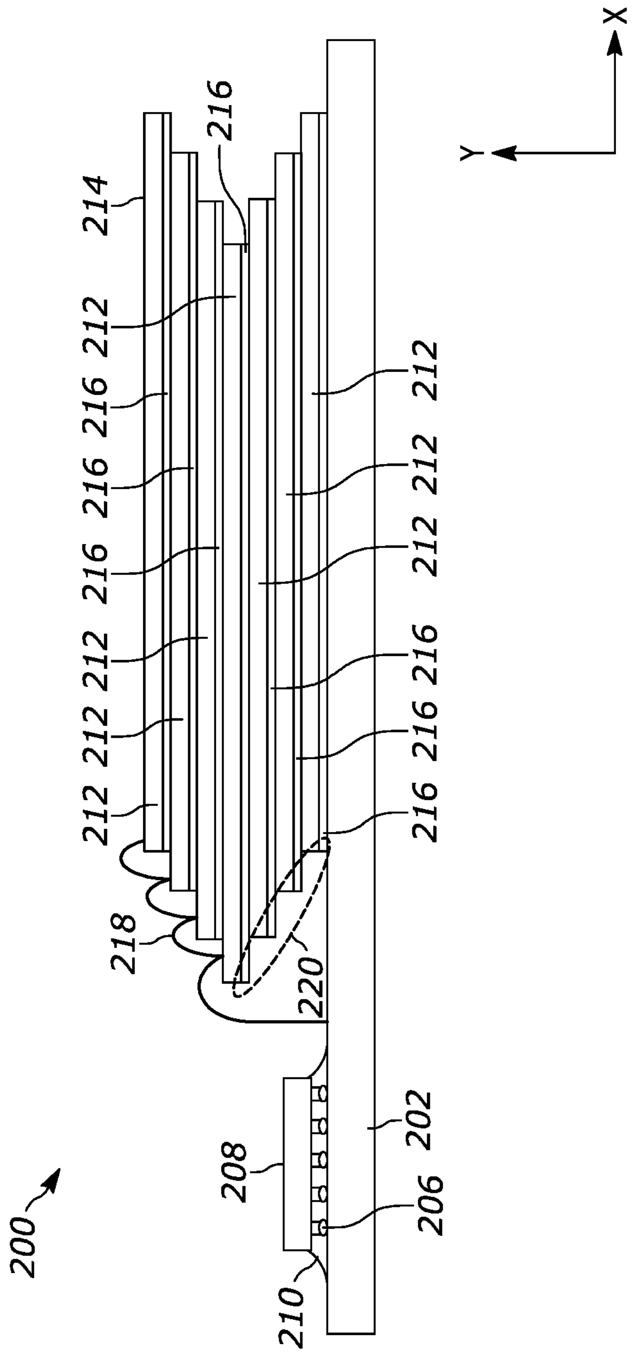
FIG. 2 is a diagram illustrating a memory device, according to embodiments described herein.

FIG. 2 is a diagram illustrating an example of a packaged IC 200 used in a data storage device (e.g., a memory device), according to one embodiment of the disclosure. The NVM 110 may be part of the packaged IC 200.

The packaged IC 200 includes a substrate 202. A controller die 208 is attached to the substrate 202 with a plurality of solder bumps 206 disposed between the controller die 208 and the substrate 202. The solder bumps 206 may be made entirely or partially of one or more metallic or other conductive materials such as, for instance, gold, silver, palladium, iridium, indium, silver/tin amalgams, one or more binary or ternary metal alloys, lead, and the like. An underfill 210 may be disposed between the controller die 208 and the substrate 202.

Also shown in the illustrated embodiment of FIG. 2, a stack of silicon dies 212 are disposed on the substrate 202. It should be noted herein that, while a stack of seven silicon dies 212 is shown disposed on the substrate 202, other numbers of silicon dies 212 are contemplated herein including, for instance, two, three, four, five, six, eight, nine, or some other suitable number. In some example embodiments, the silicon dies 212 are NAND dies. In some embodiments, this arrangement of the stack of silicon dies 212 and the controller die 208 may be attached to the substrate 202 during the same or a parallel assembling phase and at approximately the same time.

Each silicon die 212 includes a contact pad surface 214 including a contact pad (only one of which is labelled for the sake of clarity). Opposite from the contact pad surface 214, an adhesive (such as, for example, a die attach film) 216 is used to adhere each silicon die 212 to the contact pad surface 214 of an adjacent silicon die 212. The adhesive 216 attaches the first silicon die 212 to the substrate 202. In some embodiments, the stack of silicon dies 212 may be adhered to each other prior to adhering the stack to the substrate 202. In other embodiments, the silicon dies 212 may be added one or more at a time after initially attaching the first silicon die 212 to the substrate 202. In some embodiments, a bottom silicon die 212 may be attached to the substrate with a plurality of solder bumps, such as the solder bumps 206 illustrated with respect to the controller die 208.

The contact pad surface 214 of each silicon die 212 faces away from the substrate 202. This arrangement allows for electrical connectors (e.g., bond wires), such as one or more wires 218, to electrically couple the silicon dies 212 to the substrate 202 (e.g., to wires or traces on or embedded in the substrate 202) and, therefore, to other electrical components (such as the controller die 208, for instance). In some embodiments, the wires 218 may be made entirely or partially of one or more metallic or other conductive materials such as, for instance, copper, aluminum, gold, palladium, indium, iridium, various silver/tin amalgams, lead, as well as binary and/or ternary metal alloys, and the like. In some embodiments, the wires 218 is a round or substantially round wires, but other embodiments may include wires 218 that are flat or ribbon-type wires.

To facilitate the connection of the wires 218 to the contact pad on the contact pad surface 214 of each silicon die 212, the illustrated embodiment of the packaged IC 200 includes the silicon dies 212 stacked in an offset manner, resembling a flight of stairs. This stair shape creates a lower exposed section 220 between the silicon dies 212 and the substrate 202. Other embodiments may include different arrangements of the silicon dies 212. Some embodiments may include silicon dies 212 offset due to having varying sizes and/or shapes. Although not shown in FIG. 2, controller die 208, stack of dies 212 and bond wires 218 may be encapsulated with a molding compound, and solder balls may be attached to a bottom side of the substrate 202 to allow for external electrical communication.

Figure 3:
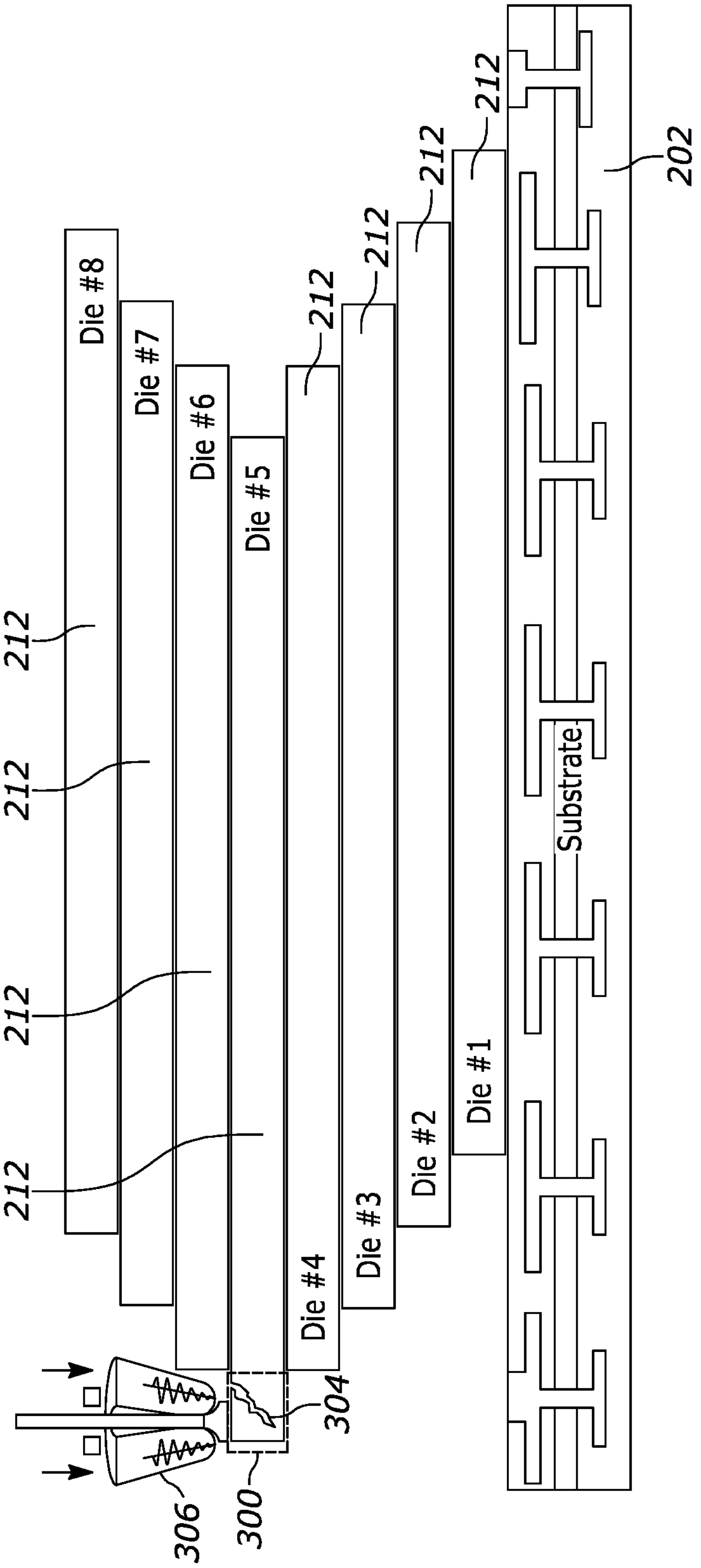
FIG. 3 is a diagram illustrating die cracking on a memory device, according to a comparative example.

During the bonding process to bond wires 218 to the contact pad surface 214 of each silicon die 212, a downward force is applied onto each silicon die 212 by a wire bonding device 306, shown in FIG. 3. As the silicon dies 212 are offset laterally, one silicon die 212, such as a silicon die 212 in the center of the stack of silicon dies 212, includes an overhang portion 300 that overhangs past any other silicon die 212. In the example of FIG. 3, the overhang portion 300 has no support. Accordingly, when downward force is applied onto the overhang portion 300 to bond the bond wire 218, a crack 304 may form in the overhang portion 300, damaging the respective silicon die 212. Traditionally, the width of the silicon dies 212 is increased to avoid the crack 304 during wire bonding. However, increasing the width of the silicon dies 212 also increases the size of the packaged IC 200.

To provide additional support for the overhang portion 300 without increasing the width of the silicon dies 212, embodiments described herein provide a support structure for the overhang portion 300. The support structure is provided beneath the overhang portion 300 to provide support during the wire bonding process, reducing instances of a crack 304 in the respective silicon die 212.

Figure 4:
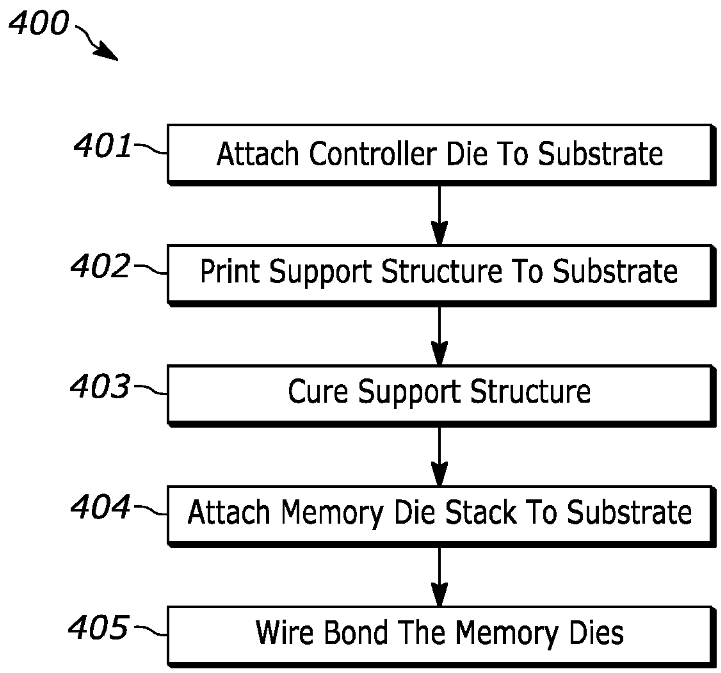
FIG. 4 is a flowchart illustrating a method of assembling the memory device of FIG. 2.

FIG. 4 provides a flowchart illustrating an example method 400 of assembling the packaged IC 200. The method 400 includes attaching the controller die 208 to the substrate 202 (at step 401). The attaching of the controller die 208 to the substrate 202 may include, for instance, depositing solder bumps 206 on respective pads of the controller die 208, flipping the controller die 208, positioning the solder bumps 206 on connectors of the substrate 202, re-melting the solder bumps 206 (using, for instance, hot air reflow), and applying underfill 210 (using, for instance, capillary action with an electrically-insulating adhesive). The underfill 210 is then allowed to dry/cure.

Figure 5:
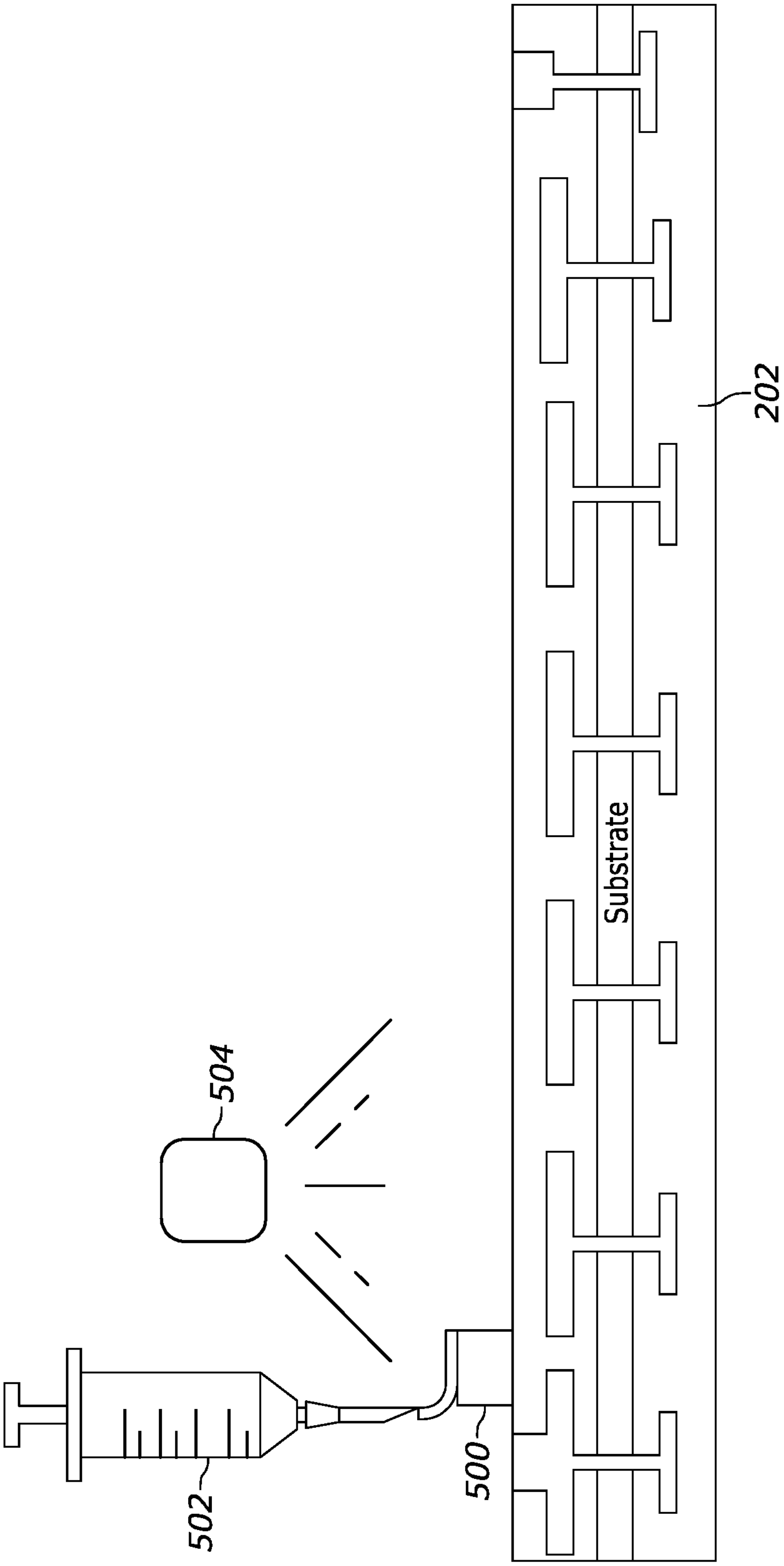
FIG. 5 is a diagram illustrating a first phase of the assembling process of FIG. 4, according to a first example.

The method 400 includes printing a support structure 500 to the substrate 202 (at step 402). For example, as shown in FIG. 5, a printing device 502 (for example, a 3D printing device) prints a support structure 500 directly onto the substrate 202. The printing device 502 may be a 3D inkjet printing device that prints elastomeric material. The support structure 500 may be composed of an elastomeric material having high elasticity and a high dielectric constant compared to a rigid material, which relieves interface strain between a silicon die 212 and the support structure 500. In some instances, the printing device 502 is a contactless printing device 502 to reduce contaminations and damage to the substrate 202 during the assembling process.

Figure 6:
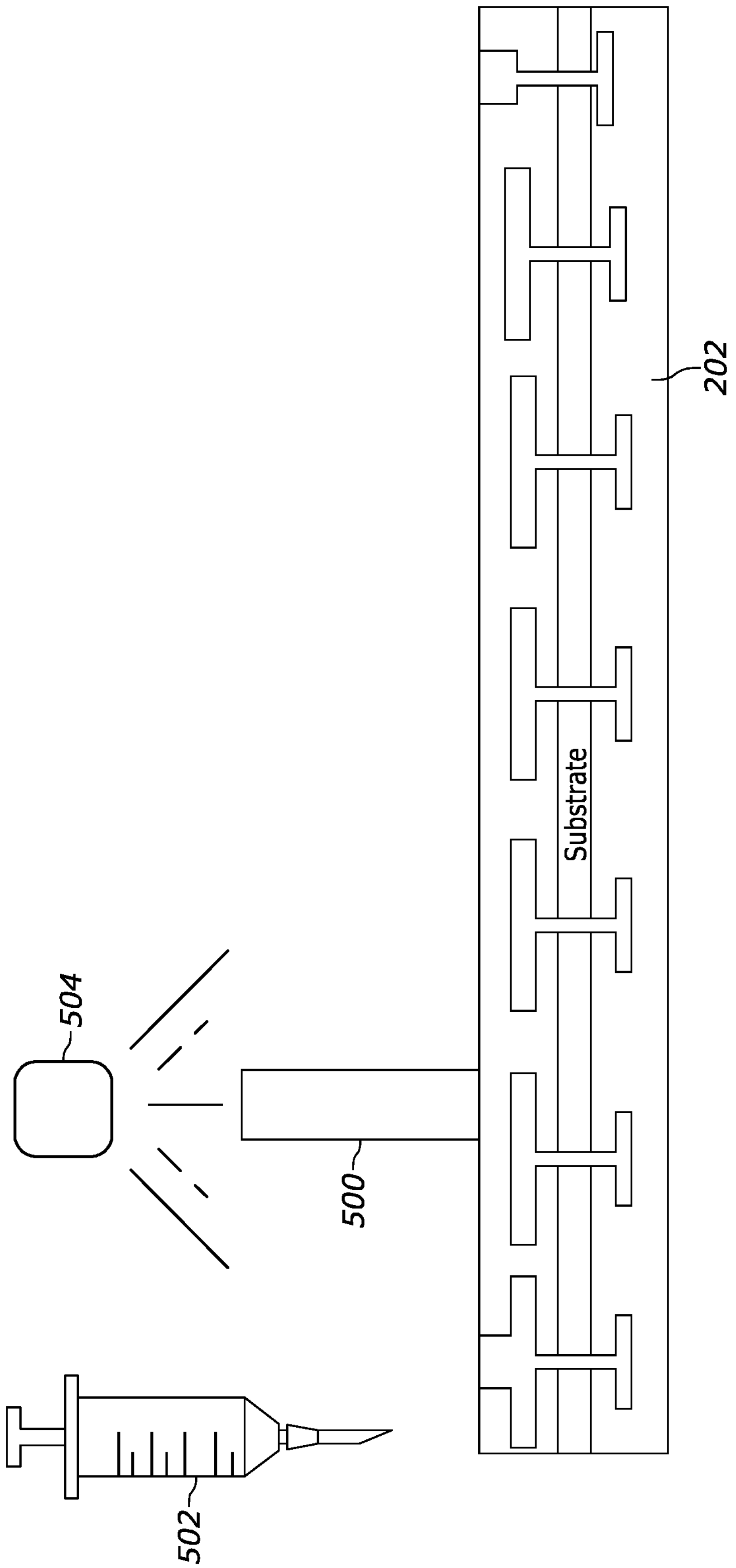
FIG. 6 is a diagram illustrating a second phase of the assembling process of FIG. 4, according to the first example.

The method 400 includes curing the support structure 500 (at step 403). For example, an ultraviolet (UV) light source 504 is provided to assist with solidifying the support structure 500 during printing. The UV light source 504 cures the support structure 500 to solidify the support structure 500 both during the printing process (shown in FIG. 5) and after the printing process (shown in FIG. 6). In some implementations, once the support structure 500 is cured, the support structure 500 is permanently fixed to the substrate 202.

Figure 7:
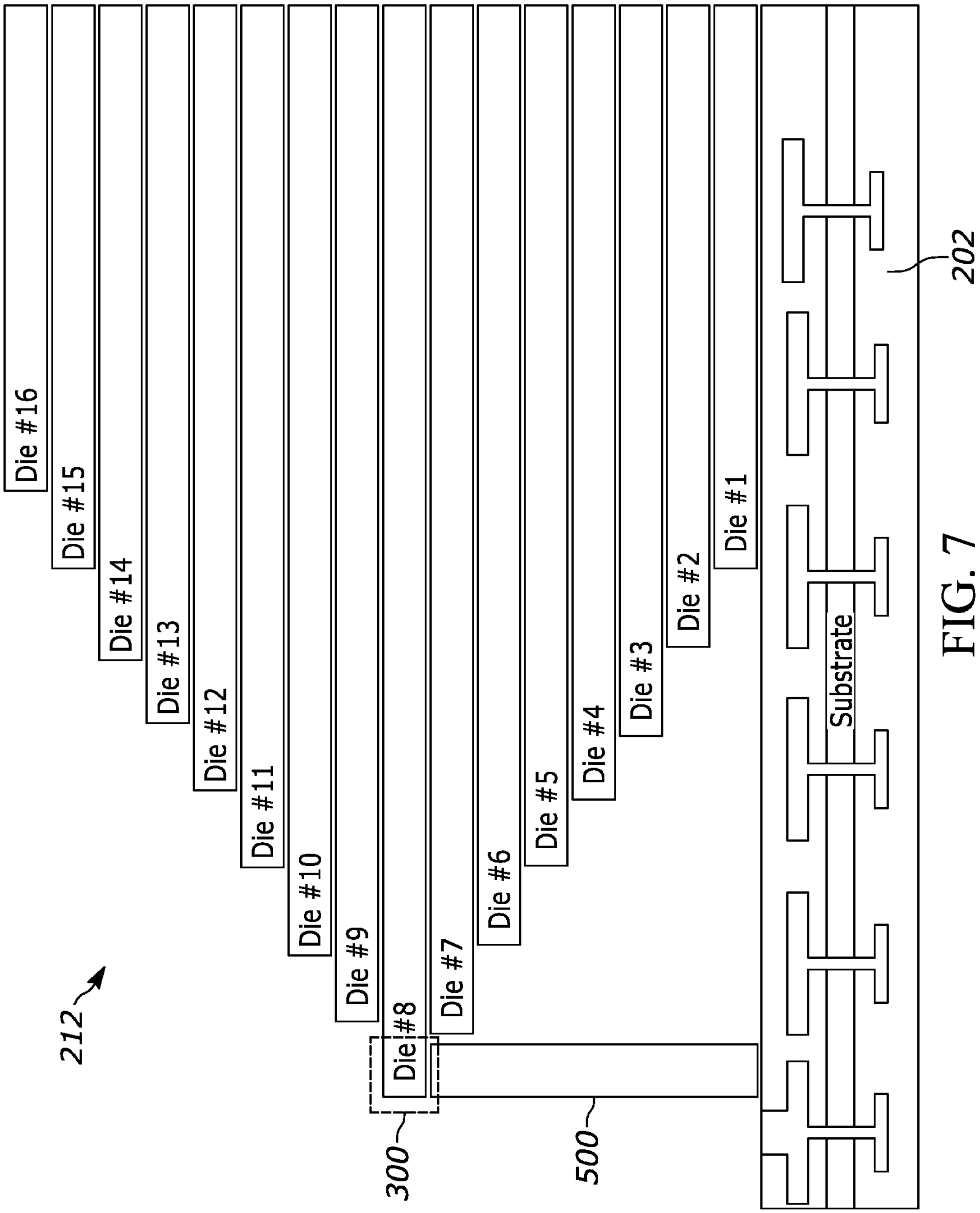
FIG. 7 is a diagram illustrating a third phase of the assembling process of FIG. 4, according to the first example.

The method 400 includes attaching the memory die stack (e.g., the stack of silicon dies 212) to the substrate 202 (at step 404). The attaching of the stack of silicon dies 212 to the substrate 202 may include, for instance, attaching the silicon dies 212 to each other prior to attaching the stack of silicon dies 212 to the substrate 202. Other embodiments may include attaching one silicon die 212 to the substrate 202, attaching a second silicon die 212 to the top surface of the first silicon die 212, and so forth until all silicon dies 212 are placed. The silicon dies 212 are arranged such that a portion of each top surface (also referred to as the "contact pad surface 214") of the corresponding silicon die 212 is exposed. This arrangement may be accomplished by staggering the silicon dies 212, utilizing silicon dies 212 of varying sizes/shapes, or the like. A bottom silicon die 212 may be attached to the substrate 202 via an adhesive material or may be soldered to the substrate 202. For example, attaching of the silicon dies 212 to the substrate 202 may include, for instance, depositing solder bumps on respective pads of the bottom silicon die 212, flipping the stack of silicon dies 212, positioning the solder bumps on connectors of the substrate 202, and re-melting the solder bumps (using, for instance, hot air reflow). When attaching the stack of silicon dies 212, an overhang portion 300 of a silicon die 212 is aligned with the support structure 500 such that the support structure 500 support the overhang portion 300 and therefore supports the corresponding silicon die 212, as shown in FIG. 7.

Figure 8:
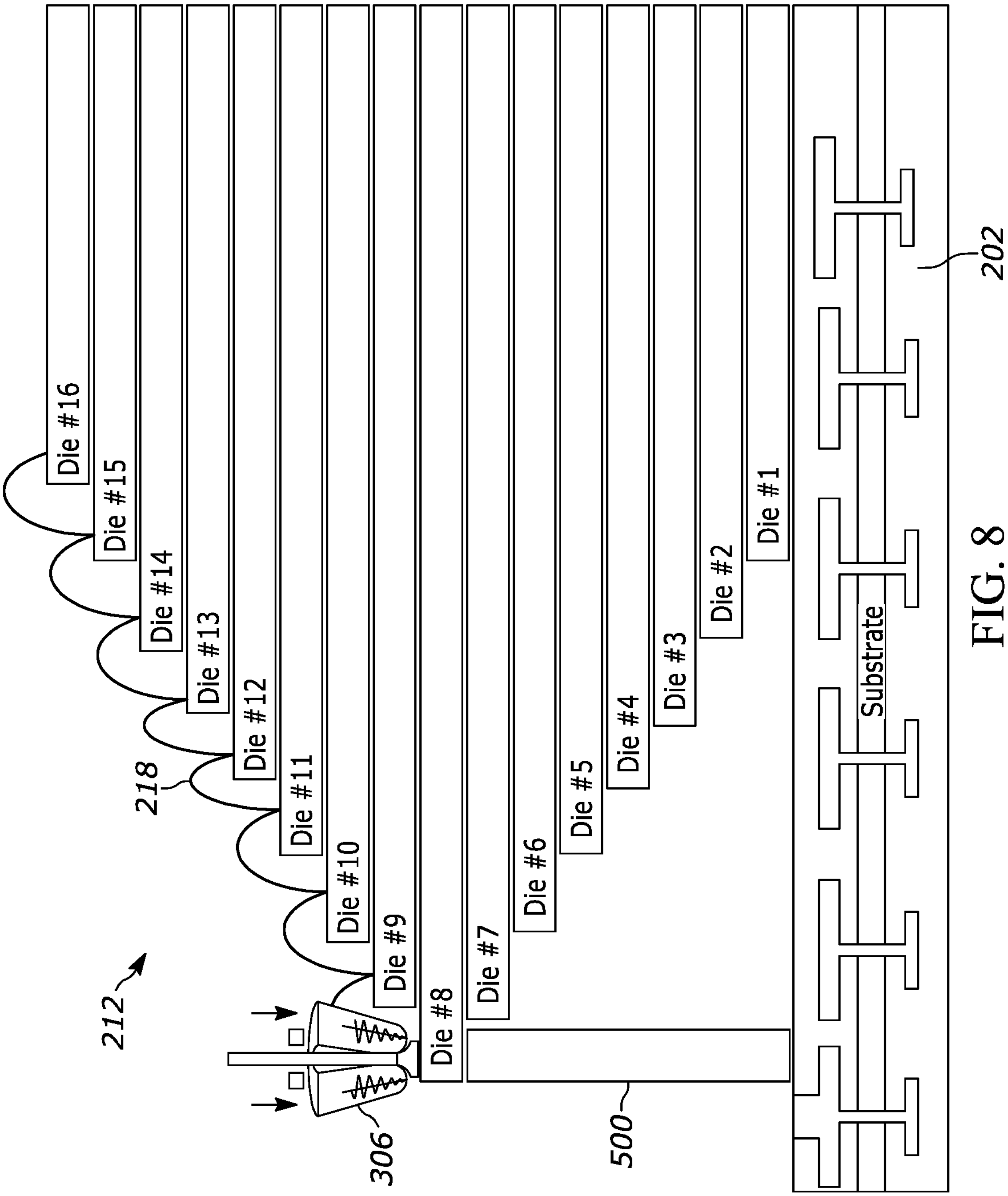
FIG. 8 is a diagram illustrating a fourth phase of the assembling process of FIG. 4, according to the first example.
Figure 9:
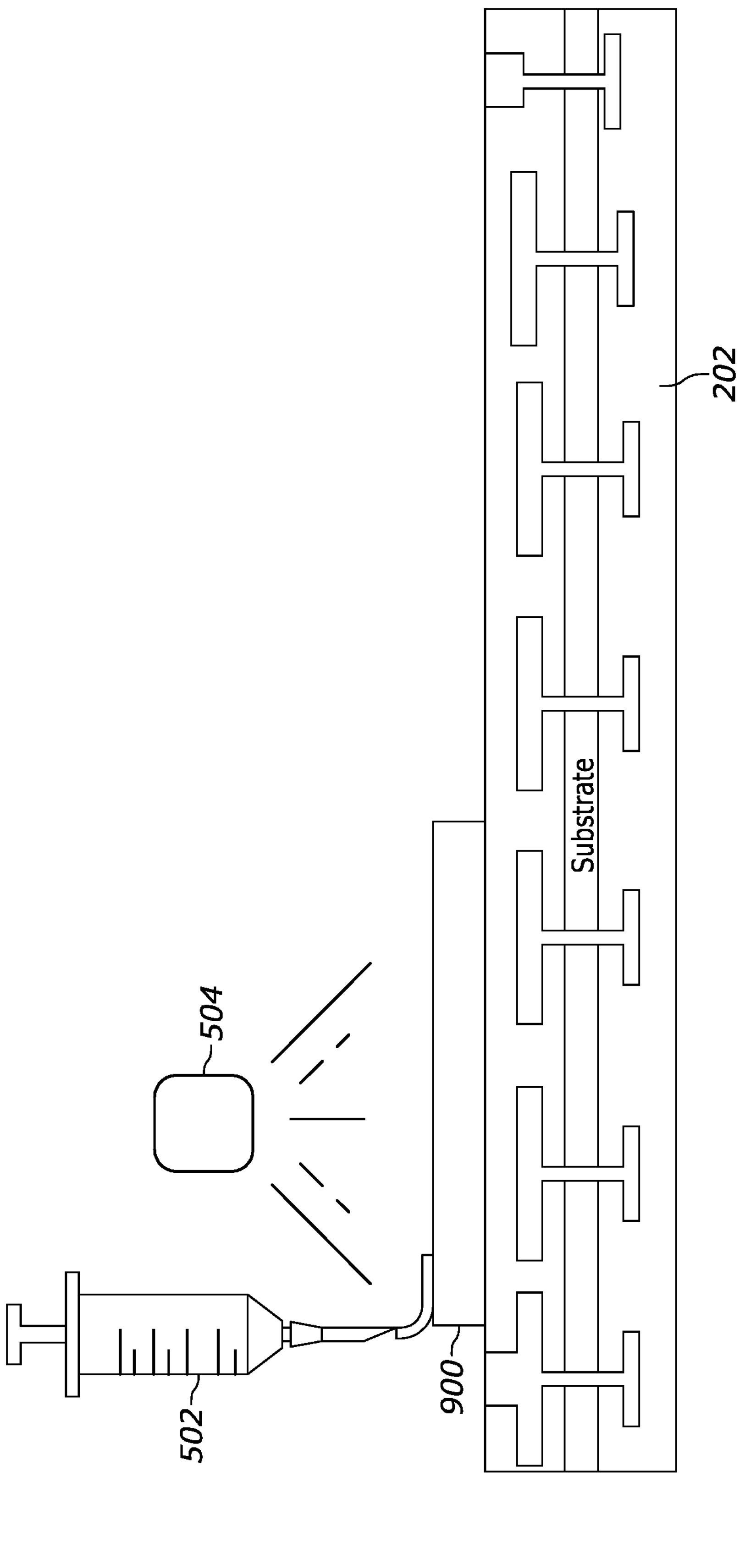
FIG. 9 is a diagram illustrating a first phase of the assembling process of FIG. 4, according to a second example.
Figure 10:
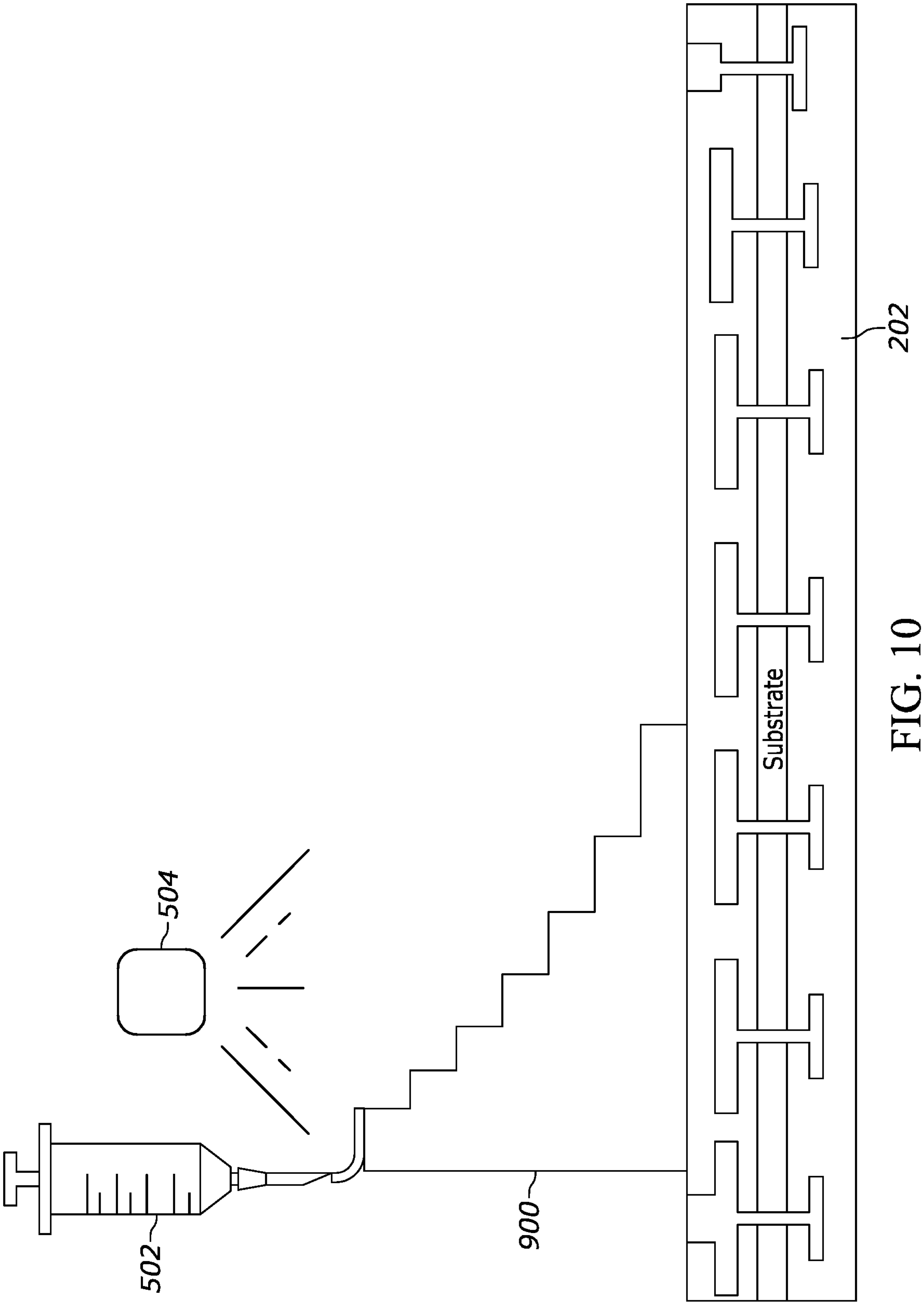
FIG. 10 is a diagram illustrating a second phase of the assembling process of FIG. 4, according to the second example.
Figure 11:
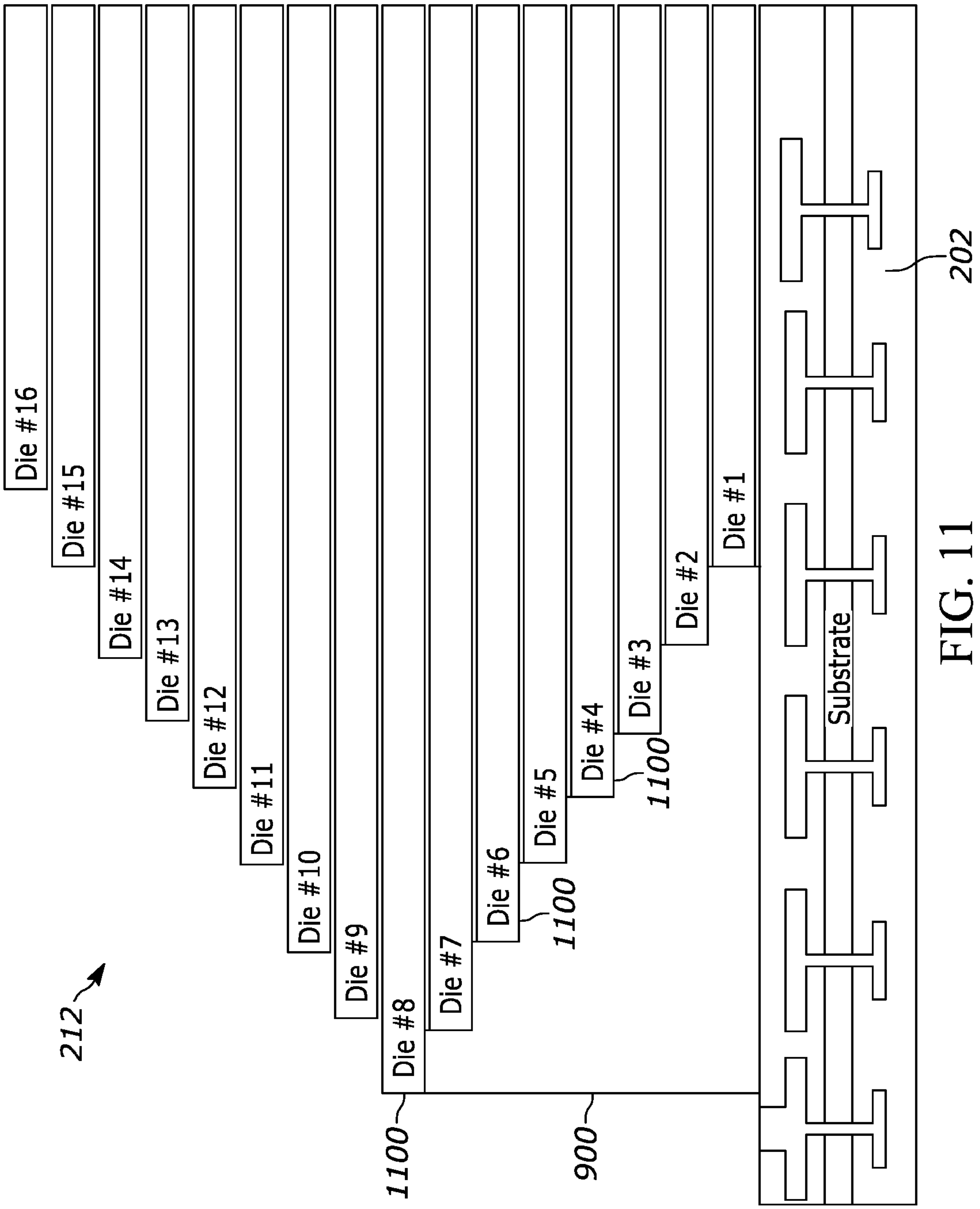
FIG. 11 is a diagram illustrating a third phase of the assembling process of FIG. 4, according to the second example.
Figure 12:
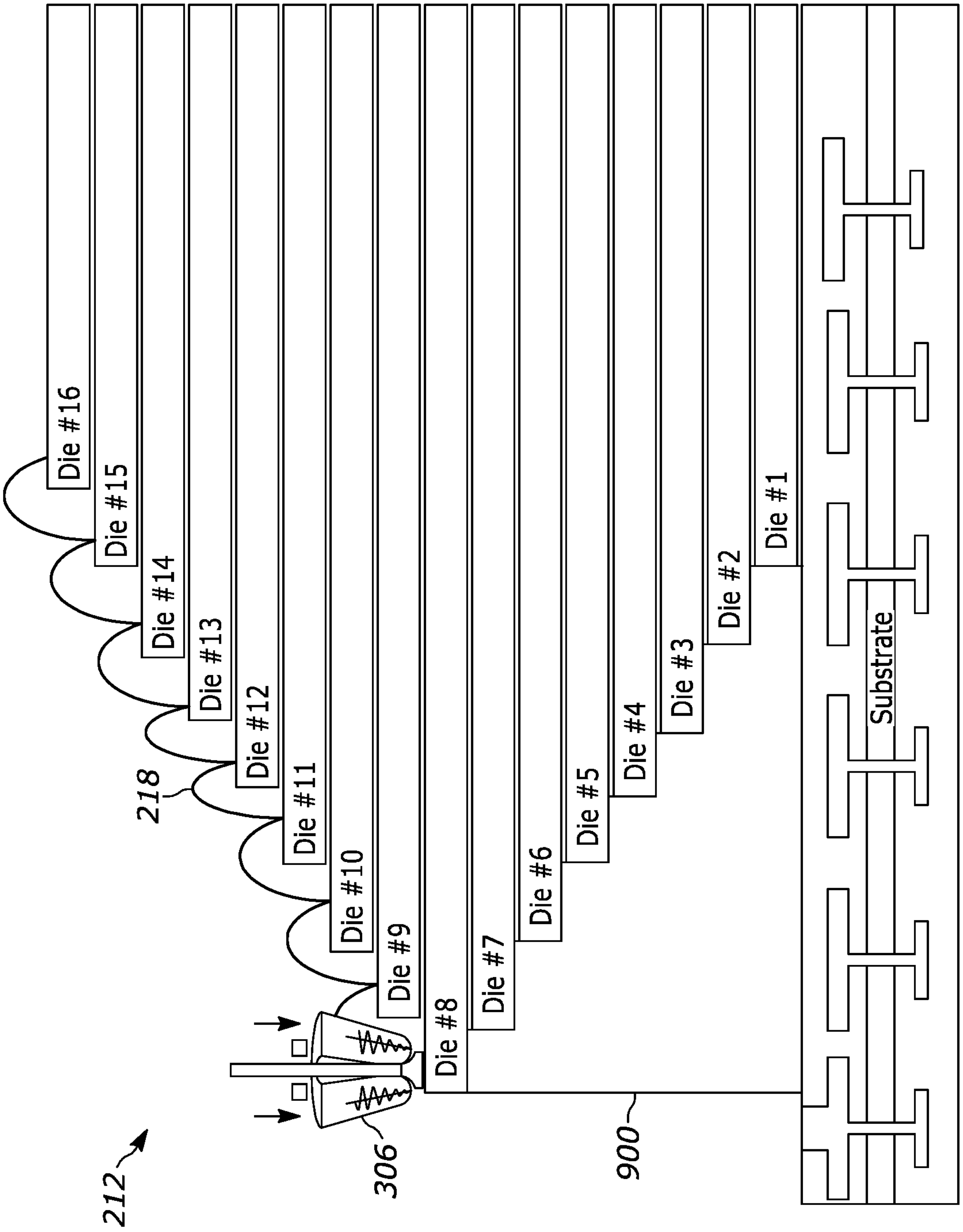
FIG. 12 is a diagram illustrating a fourth phase of the assembling process of FIG. 4, according to the second example.

The method 400 includes wire bonding the memory dies (at step 405). Wire bonding includes electrically connecting the silicon dies 212 to each other and to the substrate 202 (e.g., wires or traces on or embedded in the substrate 202), and thereby enabling electrical communication between the silicon dies 212 and other components of the packaged IC 200 such as, for instance, the controller die 208 as shown in FIG. 2. As shown in FIG. 8, the wire(s) 218 of FIG. 2 may be coupled along one or more wire paths with the wire(s) 218 contacting. for instance, the contact pad surface 214 of each of the silicon dies 212. Although only one wire 218 is shown in FIG. 8, it should be noted these illustrations include only one wire as a representation of one or more wires. Many embodiments will include several wires 218 electrically coupling the various electrical components, such as the silicon dies 212, to each other, to the controller die 208, and/or other suitable electrical components. The wires 218 may be connected between the silicon dies 212 and the substrate 202 using commercially available wire bonding machines, as is known in the art.

In some implementations, the packaged IC 200 may not include the controller die 208. In such implementations, step 401 may be omitted from the method 400, and the silicon dies 212 are attached to the substrate 202 with the support structure 500 but without the controller die 208. In other implementations, the controller die 208 may be attached to the substrate 202 after the support structure 500 is printed to the substrate 202 and/or after the silicon dies 212 are attached to the substrate 202.

The example shown in FIGS. 4-8 provides a support structure 500 contacting and supporting a single silicon die 212 having the overhang portion 300. However, in some instances, the support structure may contact and support additional silicon dies 212 in the stack of silicon dies 212. For example, with reference to FIG. 2, a portion of or all of the lower exposed section 220 may be filled by a support structure, thereby providing support to multiple silicon dies 212.

FIGS. 9-12 provide another example of a support structure 900 created by the method 400 of assembling the packaged IC 200. For example, at step 402, the printing device 502 prints a support structure 900 directly onto the substrate 202. The support structure 900 has a wider base compared to the support structure 500 (shown in FIG. 9). The support structure 900 forms a staircase (shown in FIG. 10). The UV light source 504 is provided to assist with solidifying the support structure 900 during printing. At step 403, the UV light source 504 cures the support structure 500 to solidify the support structure 500 both during the printing process (shown in FIG. 9) and after the printing process (shown in FIG. 10).

At step 404, the memory die stack is attached to substrate 202. The staircase of the support structure 900 compliments the lower exposed section 220, contacting an exposed lower surface 1100 of several silicon dies 212 and providing support to the respective silicon dies 212 (such as memory dies 1-8, shown in FIG. 11). At step 405, wire bonding is performed on the silicon dies 212 (shown in FIG. 12), as previously described.

Figure 13:
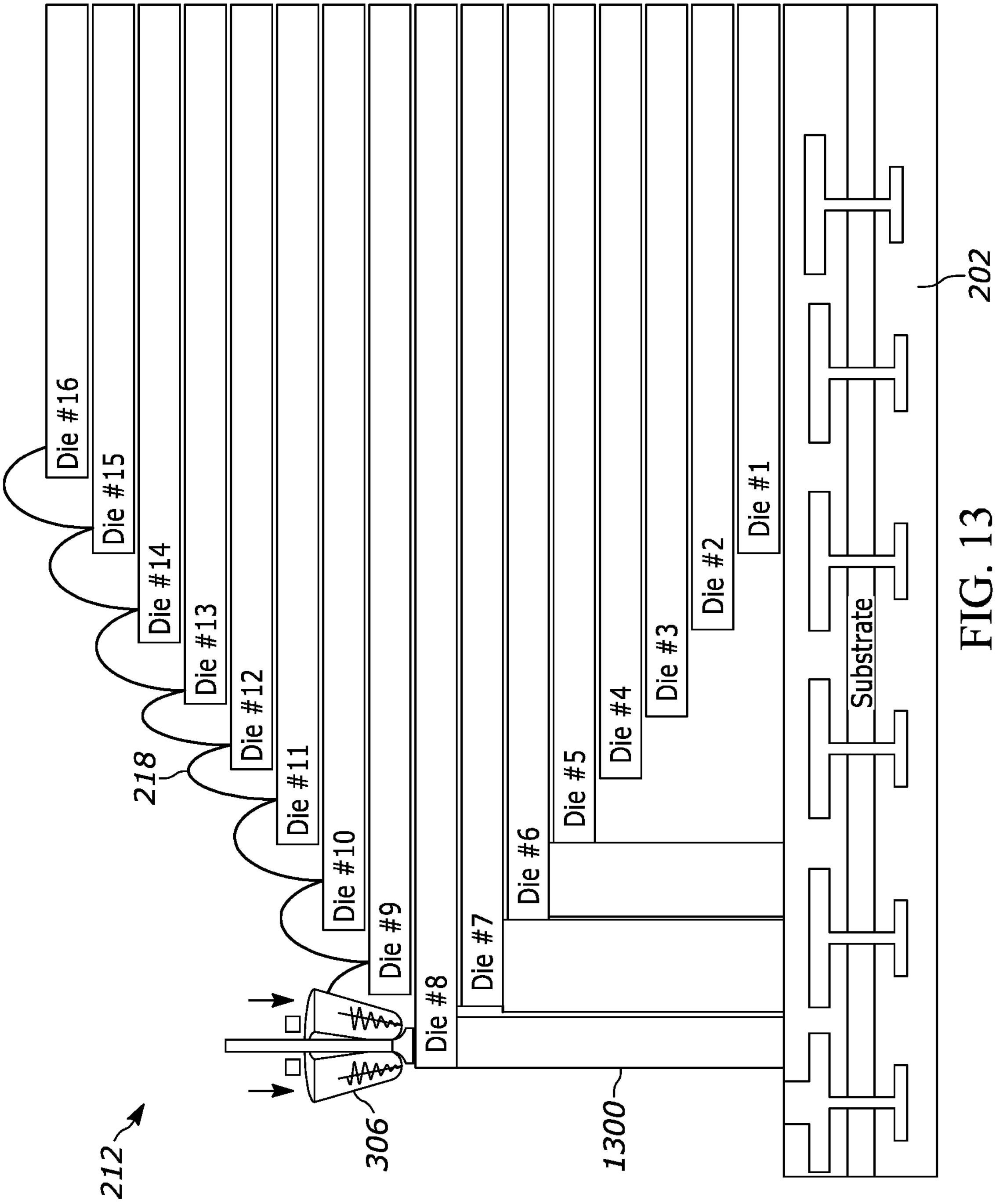
FIG. 13 is a diagram of a support structure, according to a third example.
Figure 14:
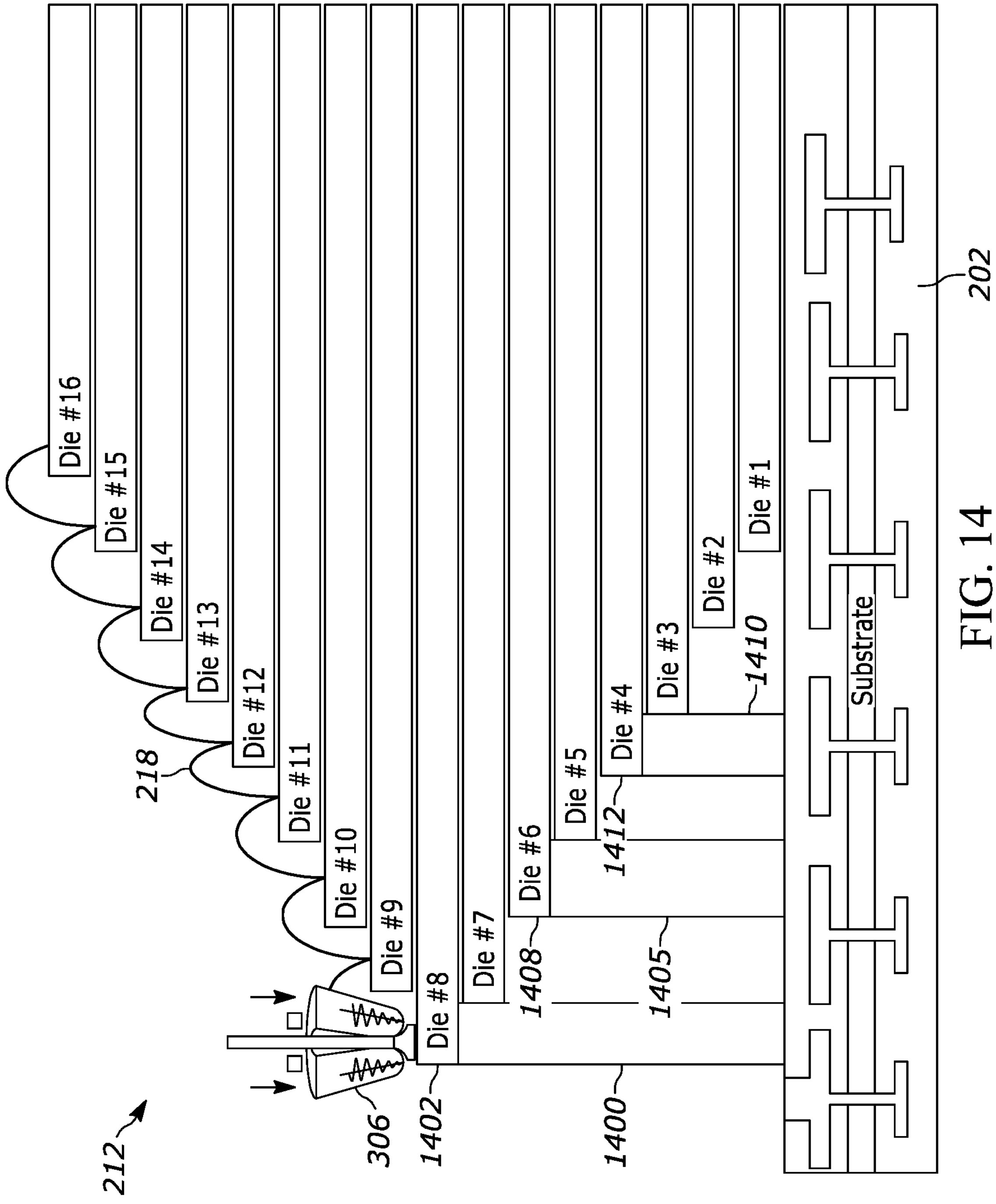
FIG. 14 is a diagram of another support structure, according to a fourth example.

In some instances, a portion of the lower exposed section 220 is supported by a support structure. For example, FIG. 13 provides an example support structure 1300 supporting three silicon dies 212 (e.g., memory dies 6-8). However, the support structure 1300 may also support fewer or greater silicon dies 212. In the example of FIG. 13, the supported silicon dies 212 are stacked directly on top of each other and are adjacent to another supported silicon die. FIG. 14 provides another example support structure having a first support section 1400 supporting a first silicon die 1402, a second support section 1405 supporting a second silicon die 1408, and a third support section 1410 supporting a third silicon die 1412. The supported silicon dies (e.g., the first silicon die 1402, the second silicon die 1408, and the third silicon die 1412) are not adjacent to one another. In some embodiments, the support structure of FIG. 14 includes fewer or greater support sections to support silicon dies. In both the example of FIG. 13 and the example of FIG. 14, a number of supported silicon dies may be selected based on a thickness of the silicon dies, a total number of the silicon dies, or a length of the overhang section.

Without the support structure, memory dies typically have a thickness of 45 microns or greater (for example, 46 microns). Providing a support structure as provided by embodiments of the present disclosure allow for a reduction in thickness of the memory dies to a thickness less than 40 microns, a thickness less than 36 microns, a thickness between 30 and 40 microns (for example, 36 microns), or the like.

While the foregoing is directed to embodiments of the present disclosure, other and further embodiments of the disclosure may be devised without departing from the basic scope thereof. The scope of the present disclosure should be determined by the following claims.

What is claimed is:

1. A memory device comprising:

a substrate;

a memory die stack including:

a first silicon die having a first contact pad surface and a bottom surface attached to the substrate; and a second silicon die stacked on the first silicon die, the second silicon die including a second contact pad surface, wherein an overhang portion of the second silicon die extends beyond the first silicon die;

a printed support structure attached to the substrate, the printed support structure supporting the overhang portion of the second silicon die; and one or more bond wires that electrically connect the first and second contact pad surfaces to the substrate, thereby electrically connecting the first and second silicon dies to a controller die by way of the substrate, wherein the printed support structure is a pillar printed directly onto the substrate and cured to the substrate with an ultraviolet light source during a printing process.

2. The memory device of claim 1, wherein the first and second silicon dies comprise memory dies.

3. The memory device of claim 2, wherein the first and second silicon dies comprise NAND dies.

4. The memory device of claim 1, wherein the memory die stack includes:

a third silicon die including a third contact pad surface, the third silicon die situated between the first silicon die and the second silicon die, wherein the third silicon die is supported by a second printed support structure.

5. The memory device of claim 1, wherein the printed support structure is composed of an elastomeric material.

6. The memory device of claim 1, wherein the first silicon die and the second silicon die each have a thickness of less than 40 microns.

7. The memory device of claim 6, wherein the first silicon die and the second silicon die each have a thickness of less than 36 microns.

8. The memory device of claim 1, wherein the second silicon die is a most laterally offset die of the memory die stack, and the pillar structure is positioned to provide vertical support to the overhang portion of the second silicon die.

9. The memory device of claim 1, wherein a first surface of the pillar structure is in direct contact with a first surface of the second silicon die.

10. The memory device of claim 1, wherein the memory die stack includes:

a third silicon die including a third contact pad surface, the third silicon die situated between the first silicon die and the second silicon die, wherein the third silicon die is supported by a second printed support structure, and wherein the second printed support structure is a second pillar printed directly onto the substrate and cured to the substrate with an ultraviolet light source during a printing process.

11. The memory device of claim 10, wherein the first printed support structure and the second printed support structure are laterally offset from one another by a length equal to the overhang portion of the second silicon die.

12. The memory device of claim 1, wherein the printed support structure is positioned adjacent to the controller die on the substrate.

13. The memory device of claim 1, wherein the memory die stack includes at least eight silicon dies with two or more of the eight silicon dies supported by a plurality of printed support structures, and wherein the plurality of printed support structures are spaced apart from one another by a length equal to the overhang portion of the second silicon die.

14. A memory device, comprising:

a substrate;

a plurality of silicon dies attached one atop another in an offset manner, wherein a bottom one of the silicon dies is attached to the substrate, wherein a second one of the silicon dies is situated above the bottom one of the silicon dies, the second one of the silicon dies including an overhang portion that hangs beyond each other silicon die included in the plurality of silicon dies; and a printed support structure that is printed directly onto the substrate and cured to the substrate with an ultraviolet light source during a printing process, wherein the printed support structure is a pillar supporting the overhang portion of the second one of the silicon dies, and wherein a first surface of the pillar is in direct contact with a first surface of the second one of the silicon dies.

15. The memory device of claim 14, wherein a third one of the silicon dies is situated between the bottom one of the silicon dies and the second one of the silicon dies, and wherein a second printed support structure supports a second overhang portion of the third one of the silicon dies.

16. The memory device of claim 14, wherein a third one of the silicon dies is situated between the bottom one of the silicon dies and the second one of the silicon dies, and wherein a second printed support structure and a third printed support structure support the third one of the silicon dies.

17. A method of assembling a memory device, the method comprising:

printing a pillar support structure onto a substrate;

curing the pillar support structure to the substrate with an ultraviolet light source during the printing;

stacking a plurality of silicon dies on the substrate, the stack of silicon dies including a first silicon die contacting the substrate and a second silicon die situated above the first silicon die and offset from the first silicon die in a lateral direction to form an offset portion, wherein the offset portion of the second silicon die is supported by the pillar support structure; and electrically connecting each silicon die included in the stack of silicon dies to the substrate with one or more bond wires.

18. The method of claim 17, further comprising:

attaching a controller die to the substrate, wherein the controller die is in electrical communication with each silicon die included in the stack of silicon dies by way of the substrate.

19. The method of claim 17, wherein the stack of silicon dies includes a third silicon die situated between the first silicon die and the second silicon die, and wherein the third silicon die is supported by a second pillar support structure, wherein the pillar support structure and the second pillar support structure are spaced apart from one another by a length equal to the offset portion.

20. The method of claim 17, further comprising printing a second support structure onto the substrate, wherein the stack of silicon dies includes a third silicon die situated between the first silicon die and the second silicon die, and wherein the third silicon die is supported by a third support structure.

* * * * *